Sept. 13, 1960 S. C. ROCKAFELLOW 2,952,815

HIGH GAIN DIRECT CURRENT AMPLIFIER

Filed Jan. 3, 1957

INVENTOR.
STUART C. ROCKAFELLOW

BY

Woodhams Blanchard & Flynn
ATTORNEYS

United States Patent Office 2,952,815

Patented Sept. 13, 1960

2,952,815

HIGH GAIN DIRECT CURRENT AMPLIFIER

Stuart C. Rockafellow, Plymouth, Mich., assignor to Robotron Corporation, Detroit, Mich., a corporation of Michigan Filed Jan. 3, 1957, Ser. No. 632,300

4 Claims. (Cl. 330—63)

This invention relates to an electrical circuit for amplifying small D.C. signal voltages and, more particularly, relates to such a circuit which will be stable and which will be effective to give a high voltage gain without excessive noise pick-up.

A vast number of amplifier circuits have been devised for particular operating requirements and such prior circuits have, in general, been satisfactory for most purposes. Nevertheless, the problem of accurately amplifying and obtaining a high voltage gain from slow changes in very small D.C. signal voltages has never, to my knowledge, been satisfactorily solved previously inasmmuch as prior amplifier circuits devised for accomplishing this purpose have caused excessive noise pick-up or were unstable or, in some circumstances, were prohibitively expensive.

One example of such use is in actuation of control apparatus in response to the voltage change in a thermocouple which, for example, in a typical case may vary a total of only 0.0015 volt throughout its entire operating range. Such extremely small voltages have been difficult to amplify accurately by previously known equipment and accordingly control apparatus dependent thereon has not been able to achieve the range of use and reliability which would otherwise be possible.

Accordingly, it is an object of this invention to provide an improved electrical circuit for amplifying relatively slow changes in D.C. signal and achieving a high voltage gain in the signal so that a load may be properly actuated therefrom.

It is a further object of the invention to provide an improved amplifier circuit, as aforesaid, which will be accurately responsive to extremely small D.C. voltage changes, of the order of 0.001 volt or less.

It is a further object of this invention to provide an improved amplifier circuit, as aforesaid, which is stable and which will operate without excessive noise pick-up.

It is a further object of this invention to provide an improved amplifier circuit, as aforesaid, which consists of a minimum of components, all of which are readily available, and which will perform in a reliable fashion.

Other objects and advantages of this invention will be apparent to those acquainted with circuits of this type upon reading the following description and inspecting the accompanying drawings, in which.

*General Description*

In general, the invention provides an amplifier circuit, which, preferably, includes a substantially conventional, crystal-controlled oscillator. The inductance in the tuned circuit in the plate circuit of the oscillator tube includes the alternating current windings of a saturable reactor. The D.C. winding of the saturable reactor is connected to the D.C. signal voltage. Changes in the D.C. signal voltage will change the inductance of the tuned circuit and cause it to approach resonance. As resonance is approached the impedance of the tuned circuit increases which causes a decrease in the plate current of the oscillator tube. This decrease in the plate current causes a decrease in voltage drop across a resistance in the plate circuit of the tube, which change in voltage drop is of much larger magnitude than the change in the signal voltage and it may then be used to actuate a load. Thus, a small change in the signal voltage is amplified to such a level that it is sufficient to actuate the load.

*Detailed description*

Figure 1:
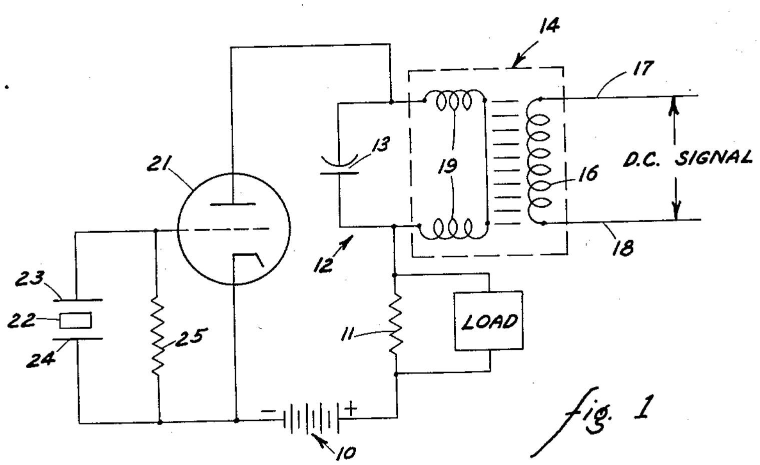
Figure 1 is a circuit diagram of the preferred embodiment of the invention.

Referring to Figure 1, there is shown a source 10 of D.C. potential. The positive terminal of said source 10 is connected through a resistance 11 to a tuned circuit 12. The load is connected in parallel with resistance 11. The tuned circuit 12 includes a capacitor 13 and the A.C. winding 19 of a saturable reactor 14 connected in parallel with said capacitor. The D.C. winding 16 of the saturable reactor 14 is connected to the D.C. input signal by conductors 17 and 18.

The tuned circuit 12 is connected to the anode of a vacuum tube 21 so that the resistance 11 is connected through the winding 19 to said anode. The cathode of the tube 21 is connected to the negative terminal of said source 10.

Alternating potential of predetermined frequency is applied to the control grid of the tube 21, preferably by means of a tuned circuit which includes a crystal 22. The crystal is positioned between two metal surfaces 23 and 24. The surface 23 is connected to the control grid of the tube 21, and the surface 24 is connected to the negative terminal of said source 10. A resistance 25 is connected in parallel with the plates 23 and 24. As is well known, small changes in the grid voltage, which are fed back between the anode and the grid within the tube, cause the crystal 22 to vibrate. Since the greatest vibration of the crystal occurs at one frequency, the crystal acts like a capacitor and an inductance that are resonant at that one frequency. A crystal-controlled oscillator is preferred since it has a more constant output frequency under varying operating conditions than do parallel connected inductance-capacitor circuits. However, the invention is by no means limited to the use of a crystal-controlled oscillator and any reliable oscillatory supply to said grid may be used.

*Operation*

The tube 21 is biased to operate as a class A amplifier. The tuned circuit 12, assuming no current flow in the D.C. winding 16 of the saturable reactor 14, is not tuned to the frequency of the crystal 22. Under such condition of the tuned circuit 12 the impedance of the circuit will be low, thus causing the plate current of the tube 21 to be high. Thus, the voltage drop across the resistance 11 is high and the voltage differential between the ends of said resistance is applied to the load.

Figure 3:
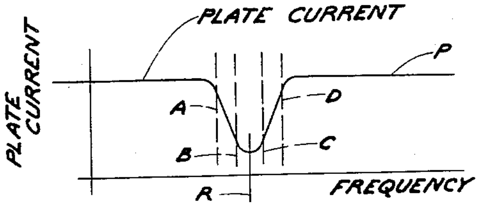
Figure 3 is a graph expressing the relationship between plate current and frequency of the oscillating circuit.

This condition is illustrated in Figure 3 wherein the line P indicates the plate current passing through the tube 21 at varying frequencies of oscillation in the oscillator circuit 12, and particularly illustrating the sharp, and relatively straight-line drop in such plate current at the point of resonance of said oscillator 12 with the frequency applied to the grid of the tube 21. As voltage from the controlling element, such as a thermocouple, is applied across the terminals 17 and 18, the reactor 14 will become saturated to a degree dependent upon the voltage applied to the D.C. winding 16 therein and as this voltage varies it will vary the frequency of the oscillator circuit 12. Thus, change in frequency of said oscillator circuit 12 is proportional to change in the controlling voltage applied between the conductors 17 and 18.

Assuming now that the input D.C. signal is at such a value that the broken line A in Figure 3 indicates the resulting frequency, it will be apparent that the oscillator 12 is still not in resonance with the pulses supplied to the grid of the tube 21 and hence the impedance provided by the resonance circuit 12 is low and the resulting plate current, and consequent voltage drop across the resistance 11, is still at a high level.

Now assuming that the controlling voltage is further increased and thereby, by decreasing the inductance of the winding 19, further increases the frequency of the resonance circuit 12 to such a value as is indicated by the line B in Figure 3. This moves the frequency of the circuit 12 in a direction approaching the frequency applied to the grid of the tube 21 and thus decreases the plate current and similarly decreases the voltage drop across the resistance 11.

Since the relationship between the changed voltage between the conductors 17 and 18 and the resulting changed frequency of the circuit 12 is substantially a straight-line relationship, and since the change in frequency of the circuit 12 and the resulting plate current passing through the resistance 11 is also substantially a straightline relationship if the parameters of the circuit are chosen to cause it to operate between the frequencies A and B indicated in Figure 3, then it will follow that the change in voltage drop across the resistance 11 will be substantially a straight-line relationship with respect to the change in voltage applied between the conductors 17 and 18.

Similarly, by further appropriate choice of the conditions of operation, the circuit may be caused to operate between the lines C and D of Figure 3. In this case an increase in the input voltage on lines 17 and 18 will again increase in the frequency of the circuit 12. This time, however, the frequency change of the circuit 12 is moving away from the frequency of resonance with the crystal 22 and this effects an increase in the plate current and a consequent increase in the voltage drop across the resistance 11.

Thus, a change in the voltage applied between the conductors 17 and 18 in either direction will, according to the portion of the resonance curve upon which the equipment is operating, result in a proportional increase or decrease in the voltage drop across the resistance 11.

Alternately, if the equipment is calibrated so that a normal condition is represented by a D.C. controlling voltage of such value that the frequency of the circuit 12 is equal to the resonance frequency indicated at R in Figure 3, then the plate current will be at a minimum and a change in the controlling signal in either direction will result in a substantial increase in the plate current and a resulting change appearing in the voltage drop across the resistance 11.

It will be evident that many specific arrangements and functions are obtainable from the circuit described by appropriately choosing the frequency range of the circuit 12 within which it is desired to operate, and that in any case an extremely small change in the controlling voltage applied between the conductors 17 and 18 will result in a relatively large change in voltage drop across the resistance 11, that is, a very large change in the output voltage available for application to a load.

By way of example, the amplifier circuit disclosed above can easily achieve voltage gains as high as 200 to 1. Thus, for a potential change of .01 volt across the thermocouple, change of 2 volts in the potential drop across the load will be effected.

*Modifications*

Figure 2:
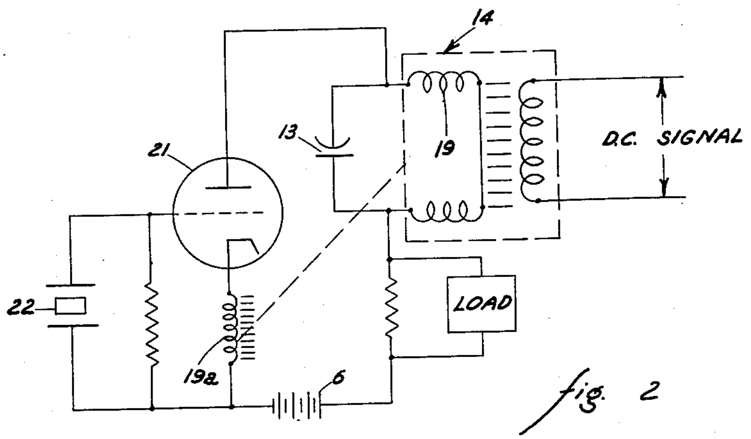
Figure 2 is a view of a modified circuit.

Referring to Figure 2, there is shown a circuit substantially the same as that disclosed in Figure 1. The same reference numerals have been applied to corresponding parts and a detailed description thereof is believed unnecessary. In this modification, the A.C. winding 19 of the saturable reactor 14 has an additional section **19*a*, which is connected in the cathode circuit of the tube 21. The operation of this embodiment is the same as that previously described. The additional section 19*a*** functions as a regenerative feed-back system and further increases the gain from the amplifier circuit.

While the foregoing description has referred to a crystal-controlled oscillator, it will be apparent that some of the objects of this invention may be achieved by the use of other types of tuned-grid, tuned-plate oscillators. Such oscillators have the disadvantage that their output frequency is subject to variation, depending on the conditions under which they are operated whereas crystal-controlled oscillators have a substantially constant output frequency under varying operating conditions, particularly temperature changes and mechanical effects. However, wherever it is possible to control the operating conditions to maintain a substantially constant output frequency under the necessary conditions of operation, such other types of tuned-grid or tuned-plate oscillators are satisfactory for the purposes of this invention.

It will be apparent that the amplifier circuit disclosed herein may be arranged in cascade fashion with one or more similar circuits, or it may be used as a first amplifier supplying any conventional amplifier with an amplifier signal from a small D.C. signal.

Although particular, preferred embodiments of the invention have been described for illustrative purposes, it is not my intention, implied or otherwise, to eliminate other variations or modifications of the invention unless specifically stated to the contrary in the hereinafter appended claims.

I claim:

1. A circuit for effecting large variations in a voltage across a load in response to small variations in a small D.C. signal voltage, comprising: an oscillator circuit including an electronic valve and a tuned circuit, said valve having input and output terminals and a control terminal for varying without terminating the current flow from said input terminal to said output terminal, said tuned circuit being connected between said input and control terminals; a resonant circuit including the A.C. winding of a saturable reactor and a capacitor connected in parallel with said A.C. winding; a load; a source of constant D.C. potential, said resonant circuit, said load and said source of D.C. potential being in series with each other and with said input and output terminals, the negative terminal of said D.C. potential being connected to said input terminal; means for supplying the variable D.C. signal voltage to the D.C. winding of the saturable reactor, whereby the current flow and resonance of said resonant circuit are varied by changes in the inductance of said A.C. winding in response to and proportional to variations in said signal voltage.

2. The circuit of claim 1 wherein said tuned circuit includes a crystal in parallel with a resistance.

3. The circuit of claim 1 wherein a load resistance is connected in parallel with said load between said A.C. winding and said constant D.C. potential.

4. A circuit for regulating the voltage across a load, comprising: an oscillator circuit including a vacuum tube having a cathode, an anode and a grid, and a tuned circuit between the cathode and grid of said tube; a saturable reactor having A.C. and D.C. windings; a resonant circuit including a capacitor in parallel with said A.C. winding; a source of D.C. potential connected in series with the load and said A.C. winding between said cathode and anode, the negative terminal of said D.C. potential being connected to said cathode; means for applying a variable D.C. voltage to said D.C. winding, whereby the current flow through said resonant circuit and said load are varied by variations in the inductance in said A.C. winding in direct response to variations in said signal voltage.

References Cited in the file of this patent

UNITED STATES PATENTS 1,596,558 Sokoloff ............ Aug. 17, 1926
1,896,238 Hund ............ Feb. 7, 1933